(12) United States Patent
Engel et al.

(10) Patent No.: US 7,793,239 B2
(45) Date of Patent: Sep. 7, 2010

(54) METHOD AND SYSTEM OF MODELING LEAKAGE

(75) Inventors: James J. Engel, Cambridge, VT (US); Susan K. Lichtensteiger, Essex Junction, VT (US); Paul J. Sulva, Jericho, VT (US); Larry Wissel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 956 days.

(21) Appl. No.: 11/379,844

(22) Filed: Apr. 24, 2006

(65) Prior Publication Data

US 2007/0250797 A1    Oct. 25, 2007

(51) Int. Cl.
G06F 17/50 (2006.01)
(52) U.S. Cl. ............................... 716/4; 716/6
(58) Field of Classification Search ............ 716/4, 716/2, 6; 702/179
See application file for complete search history.

(56) References Cited

U.S. PATENT DOCUMENTS

| | | | | |
|---|---|---|---|---|
| 5,692,160 | A * | 11/1997 | Sarin | 703/23 |
| 5,838,947 | A * | 11/1998 | Sarin | 703/14 |
| 6,842,714 | B1 | 1/2005 | Acar et al. | |
| 7,343,581 | B2 * | 3/2008 | Becker | 716/17 |
| 7,366,997 | B1 * | 4/2008 | Rahmat et al. | 716/1 |
| 2002/0174409 | A1* | 11/2002 | Cohn et al. | 716/6 |
| 2005/0044515 | A1 | 2/2005 | Acar et al. | 716/5 |
| 2005/0188230 | A1* | 8/2005 | Bilak | 713/300 |
| 2006/0074589 | A1* | 4/2006 | Cui et al. | 702/179 |
| 2006/0273821 | A1* | 12/2006 | Correale | 326/31 |
| 2006/0294491 | A1* | 12/2006 | Becker | 716/18 |
| 2007/0007996 | A1* | 1/2007 | Ranganathan et al. | 326/34 |
| 2007/0011643 | A1* | 1/2007 | Wang et al. | 716/18 |
| 2007/0201270 | A1* | 8/2007 | Chatterjee et al. | 365/185.05 |
| 2007/0250797 | A1* | 10/2007 | Engel et al. | 716/2 |
| 2008/0034337 | A1* | 2/2008 | Kuemerle et al. | 716/6 |
| 2008/0120588 | A1* | 5/2008 | Becker | 716/18 |
| 2009/0024969 | A1* | 1/2009 | Chandra | 716/5 |
| 2009/0199140 | A1* | 8/2009 | Kariat et al. | 716/5 |
| 2009/0287944 | A1* | 11/2009 | Bilak | 713/322 |

OTHER PUBLICATIONS

Abraham, J, "The VDSM Modeling Crisis is Here", Jun. 2, 2000, http://edadesignline.com/ 192200729, pp. 1-4.*
Rahul M. Rao et al., "Efficient Techniques for Gate Leakage Estimation", ISLPED '03, Aug. 25-27, 2003, Seoul Korea, Copyright 2003 ACM 1-58113-682-X/03/0008.
IEEE Article entitled: Modeling leakage in ASIC libraries by S. Lichtensteiger et al.
IEEE Article entitled: Estimation of iddq for early chip and technology design decisions by T. Hook et al.

* cited by examiner

*Primary Examiner*—Vuthe Siek
*Assistant Examiner*—Patrick Sandoval
(74) *Attorney, Agent, or Firm*—Richard Kotulak; Roberts Mlotkowski Safran & Cole, P.C.

(57) ABSTRACT

A method and system of modeling power leakage for a design comprises providing one or more cell libraries comprising parameters for particular device characteristics and providing a module configured to determine of cell leakages of a device for a PVT corner. In determining the cell leakage, the module uses the device characteristics contained in the one or more cell libraries, in combination with one or more components at a PVT for a predetermined application and an amount of devices in a leakage path (Fckt) and a leakage distribution (Fchip). There is no need to recharacterize the one or more cell libraries.

3 Claims, 7 Drawing Sheets

METHOD AND SYSTEM OF MODELING LEAKAGE

FIELD OF THE INVENTION

The invention relates generally to a method and system of modeling leakage across a device and more particularly to a method and system of accurately modeling leakage across process, voltage and temperature ranges, taking into account cross-chip variations in process parameters, that allows the total chip leakage power to be estimated prior to manufacturing the chip.

BACKGROUND OF THE INVENTION

Leakage across a device is one of today's most important VLSI design issues. Leakage is the uncontrolled ("parasitic") current flowing across region(s) of semiconductor structure/device in which no current should be flowing; e.g., current flowing across the gate oxide in MOS.

In any event, accurate and consistent leakage power estimation is critical at all stages of ASIC design. For example, cell level leakage models are needed to drive optimization tools which would allow the ASIC designer to budget real chip leakage used for power optimization in synthesis. That is, by way of illustration, it would allow the ASIC designer to use slower high threshold cells where timing is not critical and fast, but leakage prone low threshold cells when needed for timing closure. ASIC libraries are made up of cells that are comprised of a combination of transistors and capacitors connected to perform a logic function. The chip netlists describe a collection of these cells, and their connections.

Chip leakage can be estimated based on a chip netlist, using cell models and EDA tools. By way of example, to limit leakage while obtaining performance benefits, the ASIC designer can use tools such as Synopsys Power Compiler™, Cadence RTL Compiler™ or Cadence Encounter™. For example, the ASIC designer can use such tools to obtain the performance benefits of LVt (low voltage threshold) devices, while limiting leakage by using HVt (high voltage threshold) devices on non-critical paths. (It is well known that there is an exponential dependency between Vt and leakage, e.g., HVt devices leak less but are slower, while LVt transistors are faster but leak far more).

The leakage model for each cell, in each Vt variation, must accurately reflect the very large PVT (process, voltage, temperature) dependence. Library characterization using SPICE is, in principle, capable of modeling such leakage; however, SPICE techniques may not be the most appropriate technique for modeling leakage since SPICE models used for library characterization may not reflect effects important for leakage. As should be known, SPICE is a simulation technique used to simulate circuits at a transistor level.

By way of examples, SPICE modeling is typically used for timing closure, whereas, leakage is sensitive to even small process shifts which might be unimportant for timing closure. By way of further example, leakage and its temperature acceleration are functions of full-die Vt distribution, which cannot be reflected in the transistor level SPICE simulation. Moreover, SPICE characterization is not possible for certain categories of library IP. Also, it is difficult to update the SPICE models as the process matures and leakage changes in that full re-characterization of the entire cell library would be needed to address even small process shifts, e.g., Vt (voltage threshold), Tox (oxide thickness), recentering and corner re-definition, to name but a few.

Accordingly, there exists a need in the art to overcome the deficiencies and limitations described hereinabove.

SUMMARY OF THE INVENTION

In a first aspect of the invention, a method of modeling power leakage for a design comprises providing one or more cell libraries comprising parameters of cell characteristics and providing a module configured to determine cell leakages of a cell for a process, voltage and temperature (PVT) corner using the cell characteristics contained in the one or more cell libraries, in combination with one or more components that determine the acceleration of leakage due to PVT, using an amount of devices in a leakage path (Fckt) and a leakage distribution (Fchip). In this aspect of the invention, the need to recharacterize the one or more cell libraries is eliminated when parameters in the one or more components are updated.

In a second aspect of the invention, a method of modeling power leakage comprises providing one or more cell library comprising parameters for particular cell characteristics and providing a module configured to:

determine one or more components at a certain PVT (process, voltage, temperature) for a certain application; and determine an amount of devices in a leakage path (Fckt) and a leakage distribution (Fchip) to obtain cell leakages for individual cells for the certain application.

The results provided by the module in combination with cell contents from the one or more cell libraries are interfaced with an electronic design automation tool to determine cell leakages while eliminating a need to recharacterize the one or more cell libraries when parameters in the one or more components are updated.

In another aspect of the invention, a system of modeling power leakage comprises a module configured to store one or more cell libraries defining device parameters affecting leakage, which are not recharacterized for changes in process parameters, and a module which interfaces with an EDA tool. Upon request, the interfacing module obtains a sum of device parameters from the one or more cell libraries for a particular device and uses the sum to obtain leakage information for a particular PVT corner for the particular cell.

DETAILED DESCRIPTION OF EMBODIMENTS OF THE INVENTION

The invention relates to a method and system of modeling leakage across process, voltage and temperature ranges, taking into account cross-chip variations in process parameters, that allows the total chip leakage power to be estimated prior to manufacturing the chip. More particularly, the invention uses a versatile method to predict leakage in silicon across a wide process, voltage and temperature range, and across library variations such as low Vt gates applied to a method of production of cell power models.

In implementation, equations implemented in accordance with the method and system of the invention predict the leakage in CMOS logic, in which the equations use device characteristics and technology parameters to model leakage of a cell as part of a complete chip. The cell models built in the manner according to the method and system of the invention are easy to update for process shifts and can be used for both the typical voltage and temperature ranges for design synthesis and analysis, and also at elevated temperature and voltage ranges for manufacturing IDDQ screens. (IDDQ screens are a test technique based on measuring the quiescent supply current of the device under test.)

In embodiments and as discussed in more detail below, the method and system of the invention uses "per-unit" leakage values. For subthreshold leakage, in embodiments the invention uses per-unit-width "off" current of both NMOS and PMOS transistors of each Vt type at a reference temperature (Tref) and reference voltage (VddRef). For oxide leakage, in embodiments the invention uses per-unit-area current of decoupling capacitors, and per-unit-width currents separately of "on" and "off" transistors, all at VddRef. "On" transistor oxide leakage is usually specified per-unit-area rather than per-unit-width; however, since cells overwhelmingly use transistors of just one length (technology minimum), this can be scaled to a per-unit width value.

In embodiments, the method and system of the invention is applied to unique contents of each cell, where the equations of the method and system of the invention are continuous mathematical functions valid over a wide PVT range. The methods implemented herein are extremely flexible and can be used to predict leakage at any desired PVT corner, and can be implemented with cell contents extracted from cell netlists obtained in accordance with an embodiment of the invention. The cell contents may be, for example, widths of transistors of each type (e.g., RegVt, LVt, HVt,), areas of thin oxide capacitors, etc. The method and system can be applied by IEEE 1481 compiled models at run-time, as discussed in more detail with reference to FIG. 5, for example.

Figure 1:
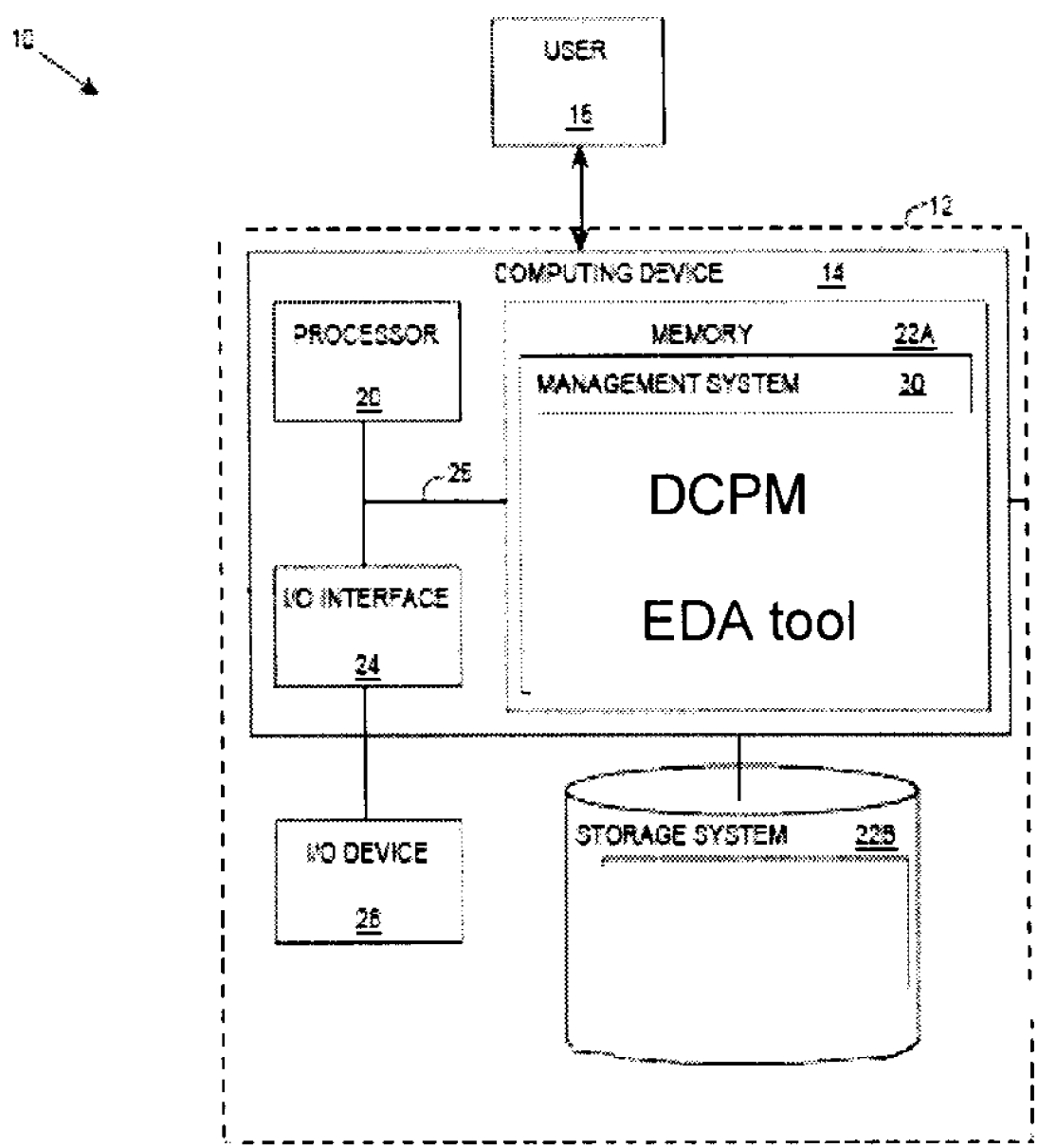
FIG. 1 shows an illustrative environment for implementing the steps in accordance with the invention.

FIG. 1 shows an illustrative environment 10 for managing the processes in accordance with the invention. The environment of FIG. 1 may contain a DPCM (delay and power calculation module) which includes a DCM (delay calculation module) interface, libraries, and an API to model leakages in combination with an EDA tool, in accordance with the invention. The environment 10 includes a computer infrastructure 12 having a computing device 14 that comprises a management system 30, which makes computing device 14 operable to perform the processes described herein. The computing device 14 includes a processor 20, a memory 22A, an input/output (I/O) interface 24, and a bus 26, all well known components which do not require further explanation. In embodiments, the DPCM and EDA tool are resident in the memory 22A.

The computing device 14 is in communication with an external I/O device/resource 28 and a storage system 22B. As is known in the art, in general, the processor 20 executes computer program code, which is stored in memory 22A and/or storage system 22B. While executing computer program code, the processor 20 can read and/or write data to/from memory 22A, storage system 22B, and/or I/O interface 24. The bus 26 provides a communications link between each of the components in the computing device 14. The I/O device 28 can comprise any device that enables an individual to interact with the computing device 14 or any device that enables the computing device 14 to communicate with one or more other computing devices using any type of communications link.

The computing device 14 can comprise any general purpose computing article of manufacture capable of executing computer program code installed thereon (e.g., a personal computer, server, handheld device, etc.). However, it is understood that the computing device 14 is only representative of various possible equivalent computing devices that may perform the processes described herein. To this extent, in embodiments, the functionality provided by computing device 14 can be implemented by a computing article of manufacture that includes any combination of general and/or specific purpose hardware and/or computer program code. Additionally, the computer infrastructure 12 can include two or more computing devices (e.g., a server cluster) that communicate over any type of communications link, such as a network, a shared memory, or the like, to perform the process described herein.

The method and system described herein is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
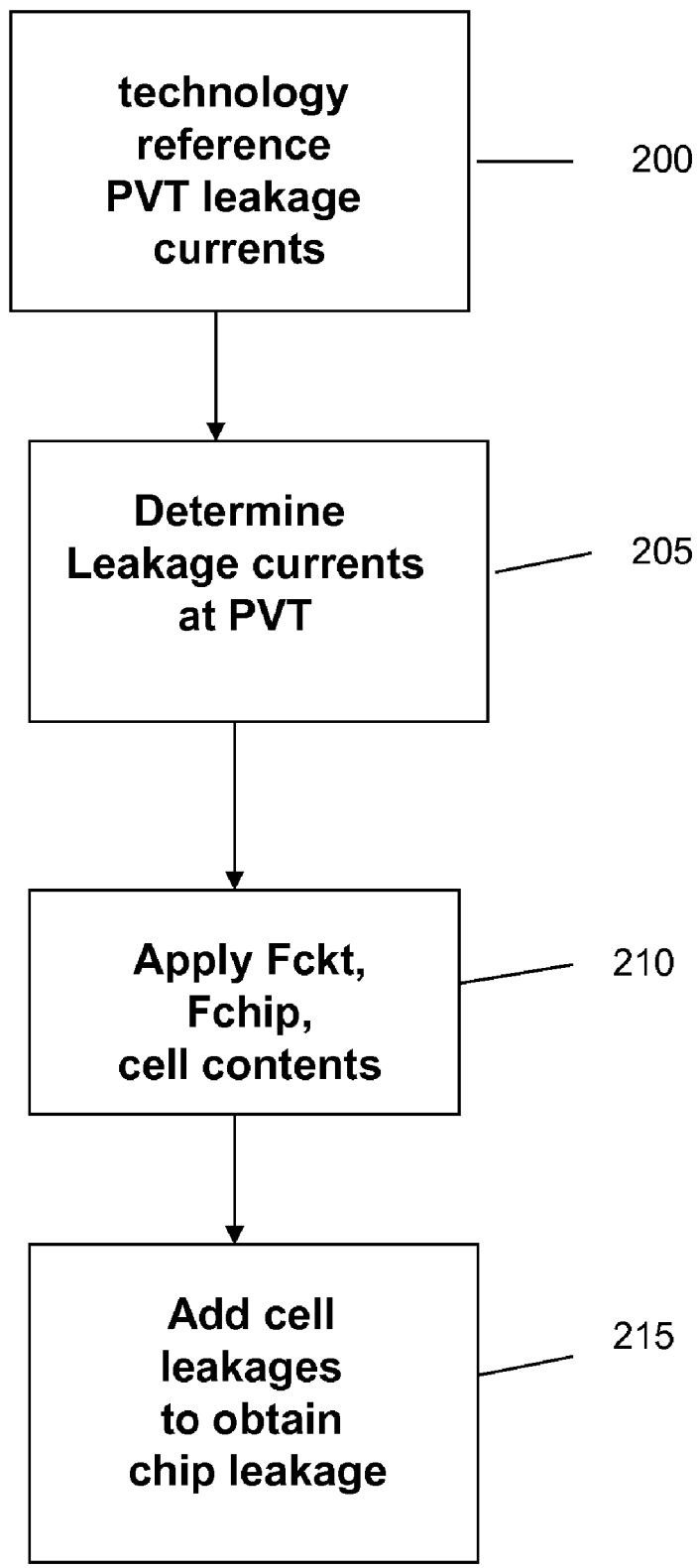
FIG. 2 show process steps in accordance with the invention.

Referring to FIG. 2, a flow chart representing process flows of the invention is shown. This and other flow charts can represent a high-level block diagram of the invention. As discussed above, the steps can be implemented in the environment of FIG. 1, for example, and can take the form of an entirely hardware embodiment, an entirely software embodiment or an embodiment containing both hardware and software elements.

Referring still to FIG. 2, the processes implemented by the method and system of the invention can involve DIBL (Drain-induced barrier lowering), ΔTox, etc., which, like timing model equations, are continuous across the PVT space. This allows a tool (electronic data automation (EDA) tool) to generate leakage estimates for application conditions, as well as at the elevated temperature and voltage of some manufacturing tests. In embodiments, the processes can be executed at run-time and can be easily updated without recharacterization of any of the cell libraries, throughout various processes.

In embodiments, at step 200, the process begins with a technology reference to PVT leakage currents at different states, which may be obtained from a technology manual. In one non-limiting illustrative example, $JsubVtRef$=0.2 nA/um $JoxideRef$=5 nA/um2

At step 205, these components (JsubVtRef and JoxideRef) are determined at a certain PVT for a certain application, e.g., using the following equations, $$JsubVt(PVT) = JsubVtRef * f(P,V,T)$$

$$Joxide(PV) = JoxideRef * f(P,V)$$

At step 210, the process applies Fckt (an amount of devices in the leakage path), Fchip and cell contents to obtain cell leakage. In embodiments, the cell contents are saved in the cell library, which do not require recharacterization in accordance with the invention. (The cell library is created in accordance with an aspect of the invention.) Fchip represents the leakage population using different distributions, e.g., SubVt and Oxide, where the leakage mechanism is known to be very non-linear. For example, the high-leakage end of a population distribution adds far more leakage than the low-leakage end of the distribution. In embodiments, the Fchip factors (SubVt and Oxide) can be changed as the process matures and distributions tighten, without recharacterization of the cells. At step 210, by way of non-limiting illustrative example, $$IsubVtCell(PVT) = Widthcell * Fckt * JsubVt(PVT)$$

$$IoxideCell(PV) = Areacell * Fckt * Joxide(PV)$$

$$IleakageCell(PVT) = FchipSubVt * IsubVtCell(PVT) + FchipOxide * IoxideCell(PV).$$

At step 215, the cell leakages are added to obtain chip leakage. This can be implemented by an EDA tool, for an "or", "and", "inverter", or any other device. By way of example, $$IleakageChip(PVT) = \Sigma_i leakageCell(i)(PVT).$$

In the above discussion, a number of assumptions (such as the "minimum length" assumption above) can be used in this prediction approach. For example, it may be true that leakage is demonstrably "wrong" for some individual library elements ("wrong" to a degree that would be absolutely unacceptable in chip timing, when an error in a single cell's hold time could render an entire design non-functional); however, for power analysis, the accuracy of leakage prediction is not meaningful at the granularity of an individual cell. Instead, it is meaningful at the granularity of a large number of cells, e.g., many thousands of cells, and the various assumptions of this approach will be demonstrated valid at that granularity. For example, in implementation, microscopic cell errors are averaged out in accordance with the invention, thus minimizing any wrong assumptions.

Additionally, in embodiments, the Vdd variation of leakage is implemented through the drain-induce barrier lowering mechanism (DIBL) for subthreshold leakage, and through observed exponential oxide leakage. The temperature variation of leakage is implemented through the temperature derivative of Vt, and through the subthreshold slope, and the process corners are implemented through ΔVt values and through ΔTox values. Thus, because continuous mathematical functions valid over a wide PVT range are used, this approach is extremely flexible to predict leakage at any desired PVT corner simply by evaluating the "per-unit" values once at the new corner.

Figure 3:
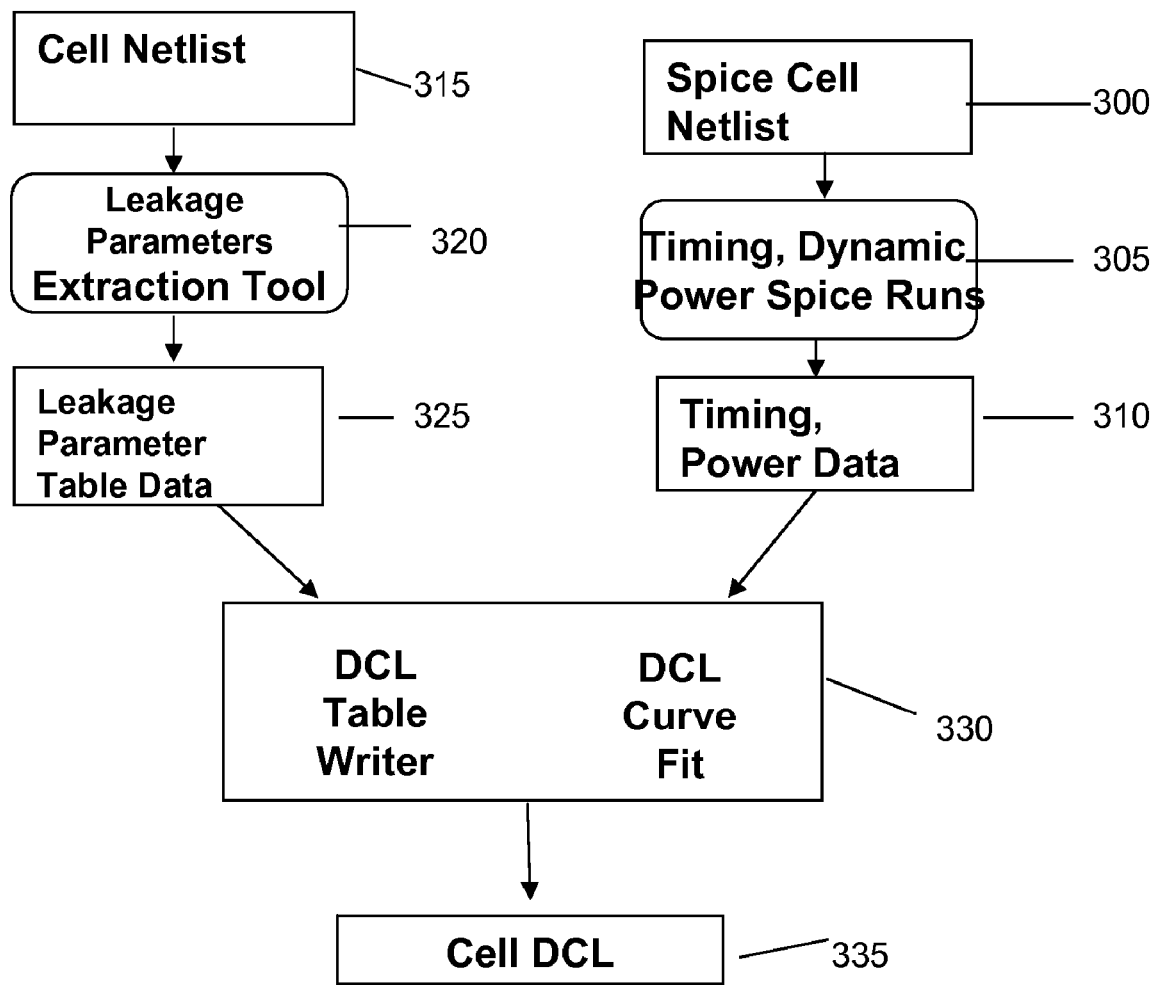
FIG. 3 represents steps characterizing a cell leakage modeling, in accordance with the invention.

FIG. 3 represents steps characterizing a cell leakage modeling, in accordance with the invention. FIG. 3 can apply to a library cell as simple as an inverter, or as complex as a large hard core. It should be recognized that steps 300, 305 and 310 are conventional steps for determining timing and dynamic power, which are currently implemented in the industry using, for example, SPICE techniques. Accordingly, only a brief description of these steps is provided herein.

On the other hand, steps 315 through 335 are implemented in accordance with the invention to provide accurate and flexible leakage models. These models can store transistor and capacitor information of the cell such that a DCM interface (discussed below) can access the information to calculate leakage.

More specifically, at step 300, a SPICE cell netlist is obtained. At step 305, using SPICE methodologies, a timing run is simulated using the netlist obtained in step 300. At step 310, timing and power data is obtained, resulting from step 305. This data is provided in step 330 to obtain a DCL (delay calculation language) curve fit, well known to those of skill in the art.

At step 315, a cell netlist is obtained using known formats. As one non-limiting illustrative example, an EDIF (Electronic Design Interchange Format) can be used as a known cell netlist format.

At step 320, a tool reads and parses the netlist to extract the device parameters, e.g., transistor and capacitor parameters such as length and area, which may affect leakage modeling. Such a tool can be readily built by one of ordinary skill in the art, in view of the teachings herein. At step 325, the system and methodology builds a table using the parsed data. More particularly, for a particular cell (e.g., "AND" cell) with multiple transistors, the system and methodology builds a table of the extracted widths of the transistors and area of the capacitors, e.g., parameters which affect leakage. At step 330, a DCL table writer uses this information to create a table, and places it to the cell DCL, at step 335. The DCL, in embodiments, is now provided for each cell. The DCL for each cell is representative of a cell level model that will be placed into a family library, in accordance with the invention.

As should be understood, each cell has a model written in DCL that contains the timing and dynamic power information, as well as a table of the total circuit transistor width for each Vt type, for each power supply. Also, by implementing the invention, there is no need to modify any library leakage model when a process corner definition is changed, or other parameter such as the Vt distribution is changed, since individual cell leakage models contain sums of transistor widths (by Vt type) and decoupling capacitance area extracted from the cell netlist. That is, using the processes described, a DCM interface obtains the information, e.g., sum of the transistor widths and the area of the capacitors, in the DCL rule for that cell and uses such information to obtain leakage information for a particular PVT corner or range for a particular cell. This can be performed without changing the created cell library.

Figure 4:
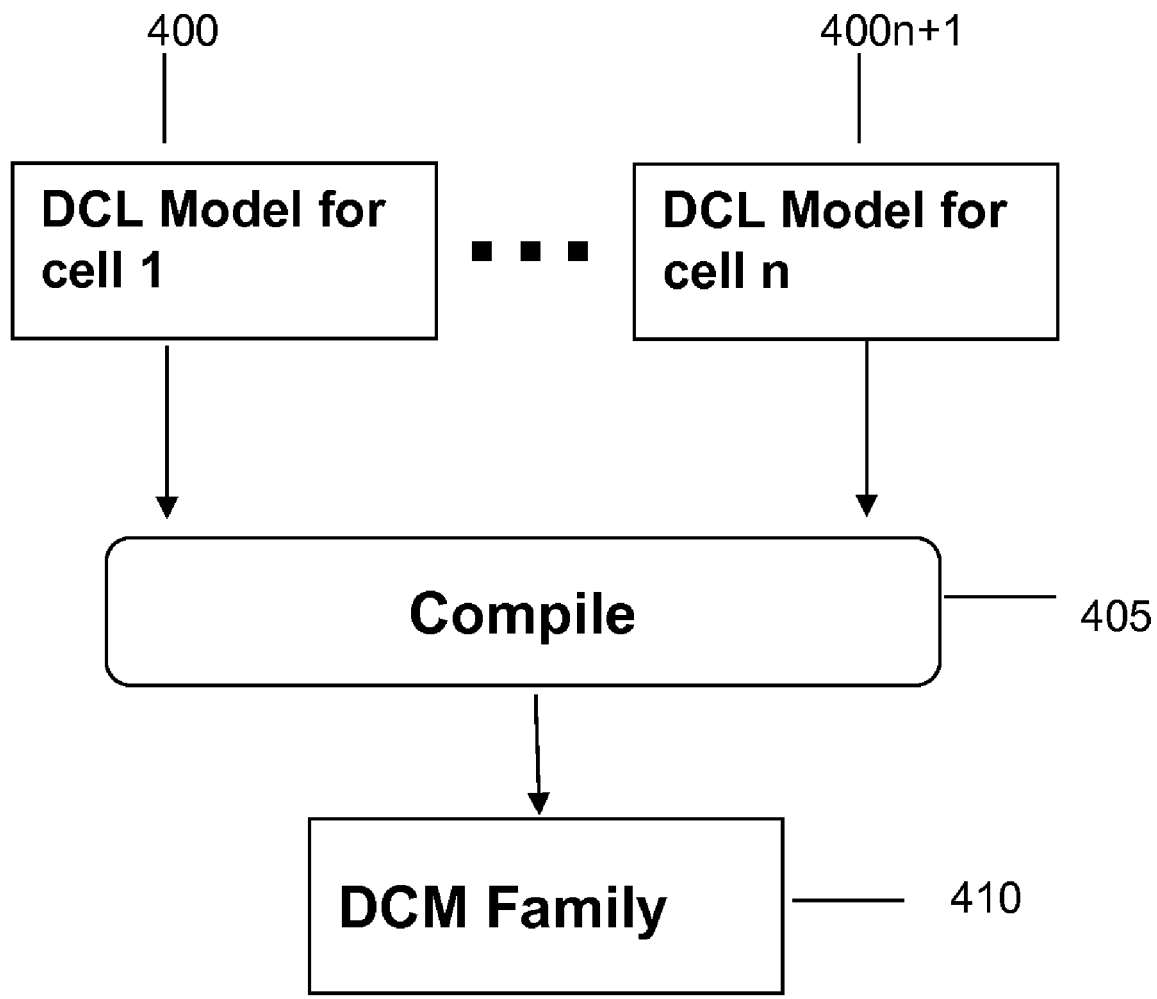
FIG. 4 shows a flow for compiling cell models into executable modules, in accordance with the invention.

FIG. 4 shows a flow for compiling the cell models into executable modules, in accordance with the invention. At steps 400-400n+1, the DCL model for a cell is provided, which may be obtained from the steps of FIG. 3. At step 405, the models are compiled. At step 410, the compiled models are provided in a family, which may encompass, for example, a collection of models of similar executable library cells. These similar executable library cells may be, for illustrative purposes, defined based upon Vt type or circuit type.

Figure 5:
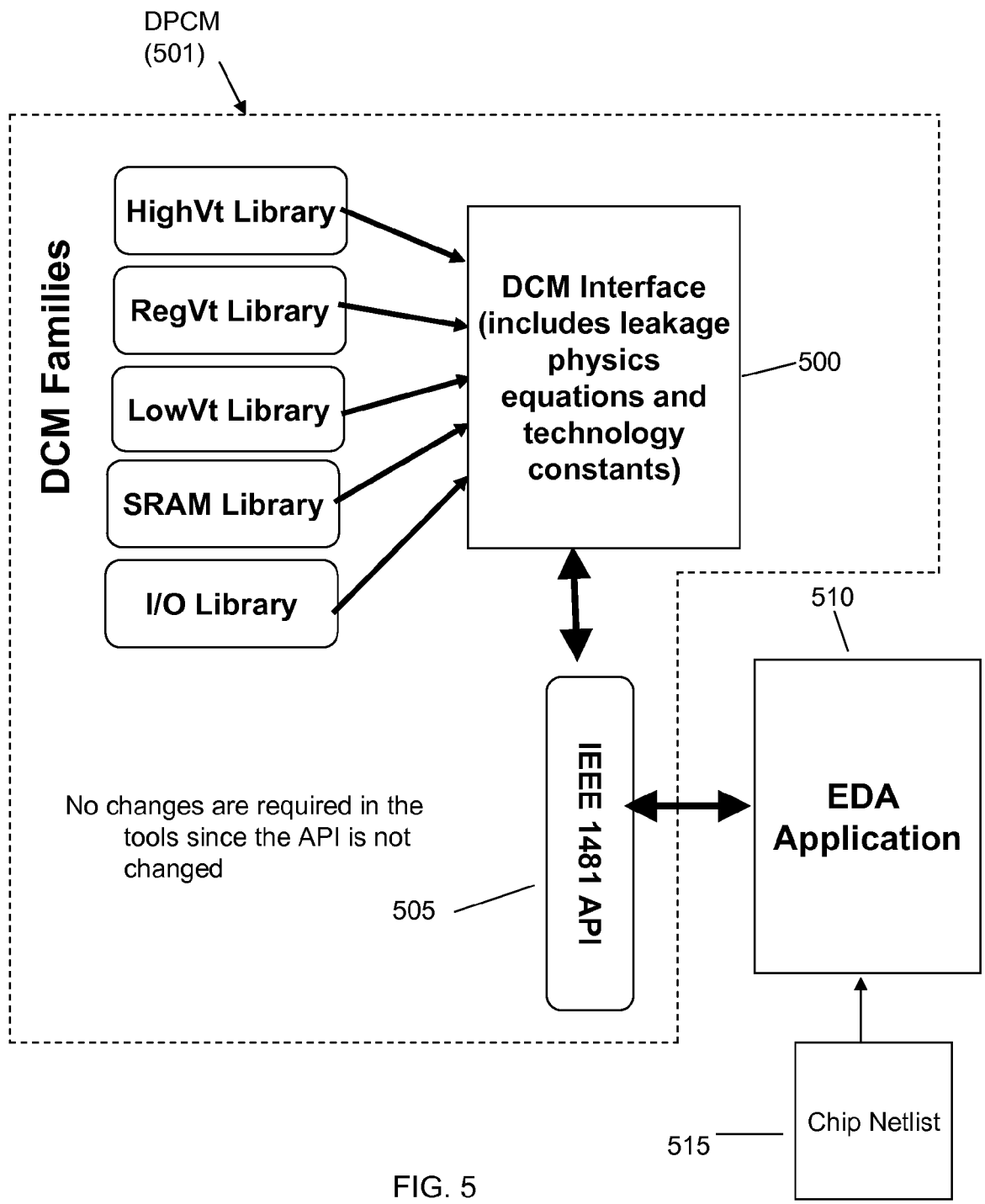
FIG. 5 shows a representation using leakage models in accordance with the invention.

FIG. 5 shows a representation using leakage models in accordance with the invention. In embodiments, using the methods and system of the invention, if a process change requires changes to the leakage calculation, then only the main DCM interface is updated and re-released. No re-characterization is required for individual cells. Thus, leakage models, described and obtained in the above manner, for the many possible configurations do not require a recharacterization of the cell libraries.

By way of more specific example, the steps of FIG. 2 (and technology constants) are provided in a main DCM (data calculation module) interface 500 with the libraries obtained in accordance with FIGS. 3 and 4. The DCM interface 500, in embodiments, contains a main executable that provides the executables to the API interface 505. The DCM interface 500 also receives the family groupings which contain the models (preferably written in DCL) for individual cells. In the embodiment of FIG. 5, a DPCM 501 is composed of the combination including the DCM interface 500, the library families and the API interface 505.

In embodiments, the API interface 505 is an IEEE 1481 API. The IEEE 1481 API allows for a variety of model descriptions, and is capable of defining an API for transferring timing and power information between the DCM Interface 500 and an EDA (electronic design application) tool 510. The API also defines a Delay Calculation Language (DCL) that facilitates the modeling of timing and power. Thus, if a process change requires changes to the leakage calculation, then only the main executable (DCM Interface) is re-compiled. No re-characterization is required for individual cells. The EDA tool 510 also obtains information from a chip netlist 515. As should be understood by those of skill in the art, the chip netlist 515 includes a list of cells which are used in the chip.

Configurable memories, such as SRAMs and Register Files, are treated in a different manner. A very large number of configurations are possible, where a configuration is defined by configuration parameters. Configuration parameters include the number of words, bits, and possibly other parameters such as column multiplex or number of subarrays that uniquely define each configuration. Because the number of possible configurations is so large, cell netlists for configurable memories are not stored in a library for each possible configuration. However, each memory is constructed of a number of kernels, where the exact kernel type and the instance count of each kernel type is defined exactly by the configuration parameters. Each kernel has a kernel netlist, which is equivalent to a cell netlist in that it contains parameters that affect leakage. Each kernel has an equation which determines the instance count of the kernel based on the configuration parameters.

A kernel equation may be illustrated with the example of the row decoders. Given the configuration parameters Nw (number of words) and Nd (column multiplex), the number of row decoders is Nw/Nd. The cell DCL, in embodiments, contains the kernel equation information.

The method and system described herein uses the memory configuration parameters, kernel equations, and kernel netlist to evaluate the total amount of parameters which affect leakage for each unique memory configuration. For example, the kernel equations are evaluated with unique configuration parameters to determine the instance count of each kernel type for the configuration; the parameters which affect leakage for that kernel type are multiplied by these instance counts to obtain a composite amount of parameters which affect leakage for all instances of each kernel type; and then the composite amount of parameters which affect leakage of all kernel types are added together to obtain the total amount of parameters which affect leakage for the memory configuration.

Figure 6A:
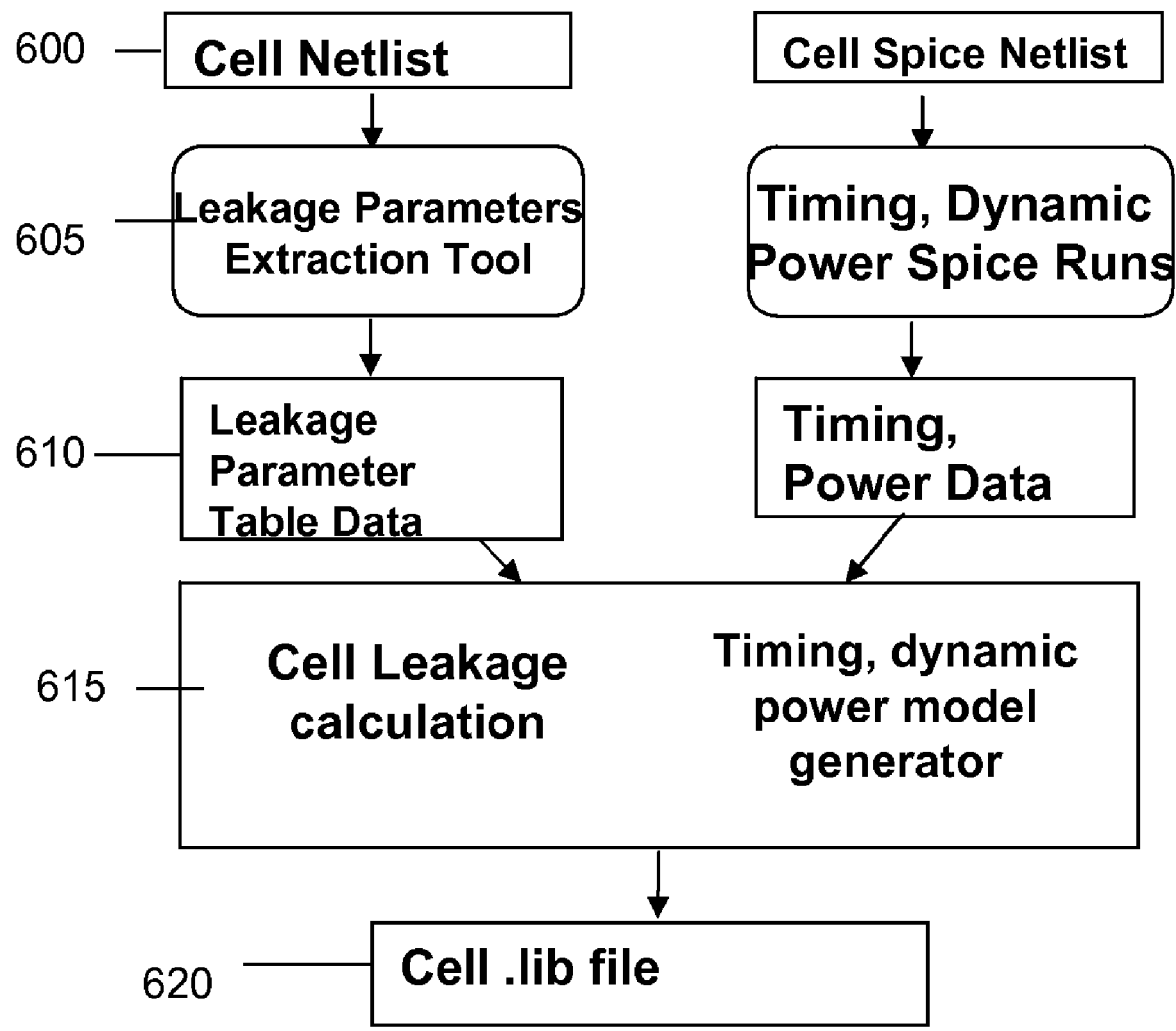
FIGS. 6a and 6b show an alternate implementation in accordance with the invention.
Figure 6B:
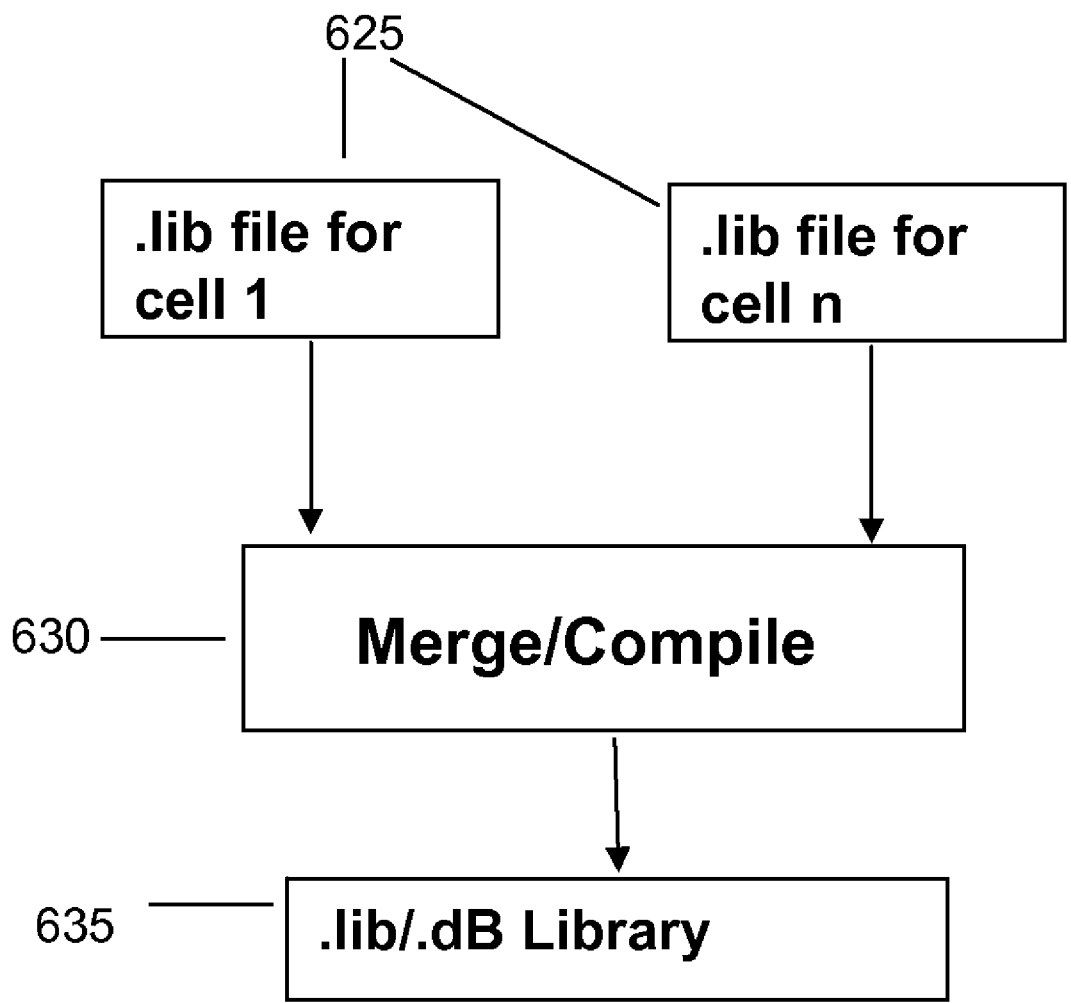

In further embodiments, ".lib" models are supported by choosing an appropriate process, voltage and temperature corner to generate a cell leakage number for the .lib model. If the IEEE 1481 API is not used, the .lib generator can be updated to provide the leakage power model for .lib files generated, where the rest of the model timing, dynamic power are generated in a conventional manner. This method can easily provide leakage values at a particular PVT point that is needed for the .lib., as shown in FIGS. 6a and 6b.

In this implementation, similar to that described with reference to FIGS. 4 and 5, the netlist is obtained, the width (or other parameters) is extracted and provided in a table (steps 600, 605, 610). However, since the .lib based flow is applicable to only one PVT, a cell leakage calculation is provided at step 615 and placed in a .lib file at step 620, for each cell. Referring to FIG. 6b, the .lib files are compiled to a .dB library or merged and placed in a .lib library, at steps 625, 630 and 635, respectively. In embodiments, the cell leakages are now pre-calculated and preloaded into memory of an electronic design automation tool, using the .lib models.

While the invention has been described with reference to exemplary embodiments, it is understood that the words, which have been used herein, are words of description and illustration, rather than words of limitation. Changes may be made, within the purview of the appended claims, without departing from the scope and spirit of the present invention in its aspects. Thus, although the invention has been described herein with reference to particular materials and embodiments, the invention is not intended to be limited to the particulars disclosed herein; rather, the invention extends to all functionally equivalent structures, methods and uses, such as are within the scope of the appended claims.

What is claimed is:

1. A method of modeling power leakage for a design, comprising:
    providing one or more cell libraries comprising parameters of cell characteristics; and
    providing a module configured to determine cell leakages of a cell for a process, voltage and temperature (PVT) corner using the cell characteristics contained in the one or more cell libraries, in combination with one or more components that determine the acceleration of leakage due to PVT, using an amount of devices in a leakage path (Fckt) and a leakage distribution (Fchip), thereby eliminating a need to recharacterize the one or more cell libraries when parameters in the one or more components are updated,
    wherein the method models power leakage for the design using a computer infrastructure, and
    wherein the determined amount of devices in a leakage path (Fckt) and a leakage distribution (Fchip) to obtain the cell leakages comprises:

$$I{sub}Vt\text{Cell}(PVT) = \text{Widthcell} * Fckt * J{sub}Vt(PVT);$$

$$I{oxide}\text{Cell}(PV) = \text{Areacell} * Fckt * J{oxide}(PV); \text{ and}$$

$$I{leakage}\text{Cell}(PVT) = F{chip}SubVt * J{sub}Vt\text{Cell}(PVT) + F{chip}Oxide * J{oxide}\text{Cell}(PV).$$

2. A method of modeling power leakage for a design, comprising:
    providing one or more cell library comprising parameters for particular cell characteristics; and
    providing a module configured to:
        determine one or more components at a certain PVT (process, voltage, temperature) for a certain application; and
        determine an amount of devices in a leakage path (Fckt) and a leakage distribution (Fchip) to obtain cell leakages for individual cells for the certain application,
    wherein results provided by the module in combination with cell contents from the one or more cell library are interfaced with an electronic design automation tool to determine cell leakages while eliminating a need to recharacterize the one or more cell library when parameters in the one or more components are updated, and wherein the method models power leakage for the design using a computer infrastructure; and further comprising calculating:

$$IsubVtCell(PVT)=Widthcell*Fckt*JsubVt(PVT);$$

$$IoxideCell(PV)=Areacell*Fckt*Joxide(PV); \text{ and}$$

$$IleakageCell(PVT)=FchipSubVt*JsubVtCell(PVT)+FchipOxide*JoxideCell(PV).$$

3. A system of modeling power leakage comprising a module which is configured to store one or more cell libraries defining device parameters affecting leakage, which are not recharacterized for changes in process parameters, and a module which interfaces with an EDA tool and, upon request, obtains a sum of device parameters from the one or more cell libraries for a particular device and uses the sum to obtain leakage information for a particular PVT corner for the particular cell, wherein the system models power leakage using the modules, wherein the module that interfaces calculates one or more components at a certain PVT for a certain application for the particular device, and applies an amount of the particular devices in a leakage path (Fckt) and a leakage distribution (Fchip) to obtain the leakage information for a particular PVT corner for the particular cell, and wherein module that interfaces calculates:

$$IsubVtCell(PVT)=Widthcell*Fckt*JsubVt(PVT);$$

$$IoxideCell(PV)=Areacell*Fckt*Joxide(PV); \text{ and}$$

$$IleakageCell(PVT)=FchipSubVt*JsubVtCell(PVT)+FchipOxide*JoxideCell(PV).$$

* * * * *